United States Patent
Punzalan et al.

(10) Patent No.: US 7,947,534 B2
(45) Date of Patent: May 24, 2011

(54) INTEGRATED CIRCUIT PACKAGING SYSTEM INCLUDING A NON-LEADED PACKAGE

(75) Inventors: Jeffrey D. Punzalan, Singapore (SG); Henry D. Bathan, Singapore (SG); Il Kwon Shim, Singapore (SG); Keng Kiat Lau, Singapore (SG)

(73) Assignee: Stats Chippac Ltd., Singapore (SG)

( * ) Notice: Subject to any disclaimer, the term of this patent is extended or adjusted under 35 U.S.C. 154(b) by 599 days.

(21) Appl. No.: 11/307,383

(22) Filed: Feb. 4, 2006

(65) Prior Publication Data

US 2007/0182024 A1  Aug. 9, 2007

(51) Int. Cl.
*H01L 33/62* (2010.01)

(52) U.S. Cl. .............. 438/123; 438/673; 257/E23.185; 257/E23.031; 257/E23.043; 257/E23.046; 257/E23.079; 257/666; 257/667; 257/668; 257/669; 257/670; 257/671; 257/672; 257/673; 257/674; 257/675; 257/676; 257/677

(58) Field of Classification Search .................. 257/663, 257/690, 692, 693, 734, 735, 784, E23.01, 257/E23.031, E23.043
See application file for complete search history.

(56) References Cited

U.S. PATENT DOCUMENTS

| | | | | |
|---|---|---|---|---|
| 4,524,121 A * | 6/1985 | Gleim et al. | ................. | 430/176 |
| 6,642,609 B1 * | 11/2003 | Minamio et al. | ............... | 257/666 |
| 6,674,156 B1 | 1/2004 | Bayan et al. | ................... | 257/670 |
| 6,700,192 B2 | 3/2004 | Matsuzawa et al. | ........... | 257/692 |
| 6,809,405 B2 * | 10/2004 | Ito et al. | ........................ | 257/666 |

* cited by examiner

*Primary Examiner* — Minh-Loan T Tran
*Assistant Examiner* — Fei Fei Yeung Lopez
(74) *Attorney, Agent, or Firm* — Mikio Ishimaru (57) ABSTRACT

An integrated circuit package system is provided including: forming a plurality of leads with a predetermined thickness and a predetermined interval gap between each of the plurality of leads; configuring each one of the plurality of leads to include first terminal ends disposed adjacent an integrated circuit and second terminal ends disposed along a periphery of a package; and forming the second terminal ends of alternating leads disposed along the periphery of the package to form an etched lead-to-lead gap in excess of the predetermined interval gap.

9 Claims, 10 Drawing Sheets

INTEGRATED CIRCUIT PACKAGING SYSTEM INCLUDING A NON-LEADED PACKAGE

TECHNICAL FIELD

The present invention relates generally to integrated circuit packaging, and more particularly to an integrated circuit packaging system including a non-leaded package.

BACKGROUND ART

As customer demand requires improved integrated circuit (IC) performance, new demands are placed on the IC packaging industry. To accommodate such demands, the IC packaging industry has had to produce faster, more reliable, and higher-density circuits while minimizing size. IC packaging must not only meet these performance demands but must also protect against various environmental conditions like moisture, contamination, mechanical vibration and temperature variations. Therefore, the correct packaging of an IC permits the microchip to function in various customer environments, such as, notebook computers, cellphones, video cameras, automobile engine compartments, portable music players, and even between the plastic layers of credit cards.

Integrated circuits can be packaged by a variety of packaging systems. One of the more common types of packaging systems is plastic packaging. Generally, plastic packaging includes the following steps: mounting IC elements to an IC pad portion of a leadframe; electrically connecting bonding pads of the IC elements to the lead portions of the leadframe with bonding wires; sealing the IC elements, bonding wires and leadframe with a molding resin; and dicing the leadframe into discrete packages.

Some of the more common types of plastic packaging techniques employed are dual in-line package (DIP), single in-line package (SIP), and thin small outline package (TSOP). The electronic devices utilizing such packaging are constantly shrinking in size while demanding increased processing power. As these faster and more powerful devices are developed, the number of leads, as well as the number of input/output (I/O) terminals, must be increased to provide power to these electronic devices.

Consequently, the semiconductor industry accommodated such demands by creating quad flatpack (QFP) packaging that employs surface mount technology (SMT). QFP's attain a higher-level lead density by forming leads on all four sides of the package. The QFP has been manufactured with the finest lead pitch for SMT plastic packaging, down to 300 micrometers. A lead pitch this fine is often the limiting factor for high yield QFP packaging because lead shortages can occur at smaller dimensions.

As demand for smaller packaging has persisted, the IC packaging industry further created the quad flat non-leaded (QFN) package. The QFN structure further reduces a packages footprint by terminating the leads at the periphery of the package (i.e.—the flange). Although the QFN structure can reduce an IC packages footprint by eliminating external peripheral lead extensions, the reduced size demands have created an increasingly finer pitch requirement between leads.

QFN packaging is typically either a dual row or single row configuration. Dual row and single row QFN packaging include a molded package, with a flange comprised by a resin and electrical conductors. The electrical conductors are commonly called leads. Of particular noteworthiness, is that the electrical conductors are situated very close together and an electrical conductor to electrical conductor gap (i.e.—the pitch between adjacent electrical conductors) is very small. Unfortunately, this finer pitch requirement has created a serious design flaw, lead-to-lead shorting. As the dimensions between adjacent electrical conductors becomes smaller, electrical cross-talk and lead-to-lead shorting become a design limitation of dual row and single row QFN packaging.

Thus, despite recent developments in QFN packaging, a need still remains for improved QFN package structures and QFN packaging methods for increasing lead density without causing lead-to-lead shortage. In view of the ever-increasing need to reduce packaging size and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit packaging system including: forming a plurality of leads with a predetermined thickness and a predetermined interval gap between each of the plurality of leads; configuring each one of the plurality of leads to include first terminal ends disposed adjacent an integrated circuit and second terminal ends disposed along a periphery of a package; and forming the second terminal ends of alternating leads disposed along the periphery of the package to form an etched lead-to-lead gap in excess of the predetermined interval gap.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGS. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the package, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "masking" as used herein defines any known positive or negative photoresist technique.

The term "etching", "half-etched", "half-etching", "partial half-etched" and "partial half-etching", as used herein, are defined as any isotropic or anisotropic chemical removal method. The terms "half-etched" and "half-etching" are further defined to include full etching of a top portion of second terminal ends of leads, while maintaining the bottom portion of the second terminal ends of the leads, to hold the leads. By way of example, and not by way of limitation, "half-etched" and "half-etching" may include fully removing the top portion of the second terminal ends of the leads while maintaining the bottom fifty percent (50%) of the second terminal ends of the leads.

The terms "partial half-etched" and "partial half-etching" are further defined to include removing material in a thickness direction and a height direction from a top portion of the second terminal ends of the leads, while maintaining the bottom portion of the leads, to hold the leads. By way of example, and not by way of limitation, "partial half-etched" and "partial half-etching" may include forming a projection within the top portion of the leads, while maintaining the bottom portion of the leads.

One embodiment of the invention comprises forming an electrically conductive layer and masking the electrically conductive layer to form leads with a predetermined thickness and predetermined interval gap between leads. The leads include first terminal ends disposed adjacent an integrated circuit and second terminal ends disposed along a periphery of a package. After defining an amount to be removed from the second terminal ends of alternating leads, the second terminal ends of the alternating leads are masked and etched to form an etched lead-to-lead gap between adjacent leads at the second terminal ends in excess of the predetermined interval gap.

Another embodiment of the invention comprises an integrated circuit non-leaded package system including an integrated circuit, with contact terminals, disposed over an integrated circuit pad. One or more leads are disposed peripherally around the integrated circuit. The one or more leads are electrically connected to the contact terminals by wires. A mold resin, for packaging, then encapsulates the integrated circuit, the contact terminals, the one or more leads and the wires. The mold resin may define the periphery of the packaging system.

The leads, which terminate at the periphery of the packaging system, include first terminal ends disposed adjacent the integrated circuit and second terminal ends disposed along the periphery of the packaging system. The second terminal ends, of alternating leads, are either half-etched or partially half-etched, to widen an etched lead-to-lead gap.

FIGS. 1 through 4 will now describe embodiments of the invention wherein dual row QFN packages and/or single row QFN packages are subject to the manufacturing technique of half-etching.

Figure 1:
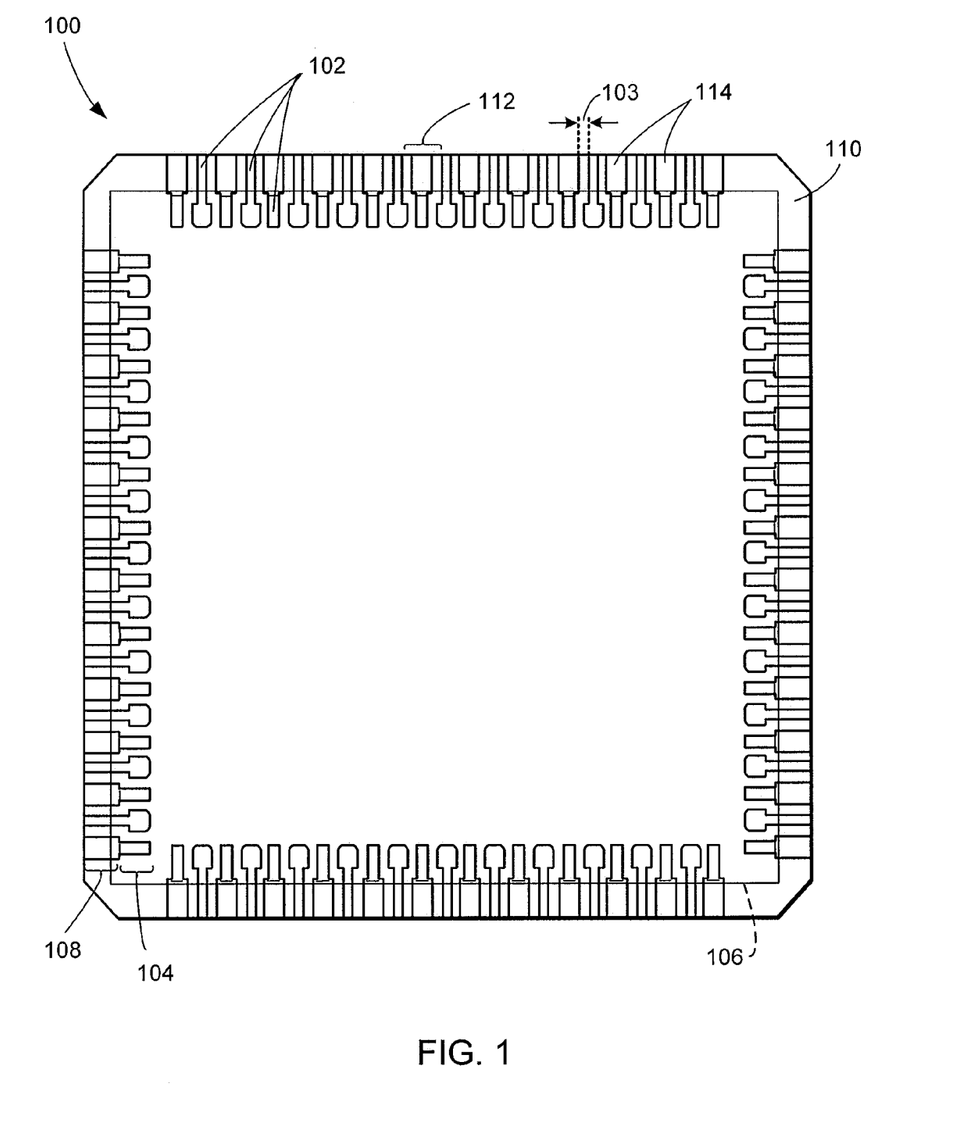
FIG. 1 is a top view of a half-etched dual row QFN package system in accordance with an embodiment of the present invention.

Referring now to FIG. 1, therein is shown a top view of a half-etched dual row QFN package system 100 in accordance with an embodiment of the present invention. The half-etched dual row QFN package system 100 includes dual row leads 102, a predetermined interval gap 103, first terminal ends 104, an molding compound 106, second terminal ends 108, the flange 110, etched lead-to-lead gaps, such as, dual row half-etched lead-to-lead gaps 112, and dual row half-etched openings 114.

The dual row leads 102 are formed at a predetermined thickness and at the predetermined interval gap 103. The predetermined thickness and the predetermined interval gap 103 between leads are determined heuristically to be as small as possible based on the size of the package while avoiding lead-to-lead shorting and/or electrical cross-talk. The dual row leads 102 are comprised by the first terminal ends 104, disposed adjacent the molding compound 106, and the second terminal ends 108, disposed along a periphery of the package, such as, the flange 110.

FIG. 1 further illustrates the formation of the dual row half-etched lead-to-lead gaps 112 by creating the dual row half-etched openings 114. For purposes of illustration and not by way of limitation, the following example is provided.

As an exemplary illustration, the second terminal ends 108 of the dual row leads 102 can be divided into a top portion (i.e.—a top half) and a bottom portion (i.e.—a bottom half). The dual row half-etched openings 114 are created by removing an amount from the top portion of the second terminal ends 108 of alternating leads. The amount removed may be up to about fifty percent (50%) (i.e.—the top half) of the second terminal ends 108 of the alternating leads. By removing up to about 50% of the second terminal ends 108, the remaining bottom portions of the second terminal ends 108 are sufficiently strong to maintain the lead. However, it is to be understood that the exact amount of the second terminal ends 108 removed is not critical, what is important is that the amount removed from the second terminal ends 108 does not exceed an amount necessary to maintain the structural integrity of the dual row leads 102 and/or the amount removed prevents the likelihood of lead-to-lead shorting between adjacent leads.

By half-etching the second terminal ends 108 of alternating leads, the dual row half-etched lead-to-lead gap 112 is increased over that of the electrical conductor to electrical conductor gap of prior art methods. By employing the half-etching method of the present invention, the distance between adjacent leads can be increased, and the incidence of lead-to-lead shorting can be reduced by about thirty-five percent (35%).

Finally, by way of example and not by way of limitation, the predetermined thickness and the predetermined interval gap 103, as mentioned above, are design parameters heuristically determined and dependent upon the specifications for the IC package. The predetermined interval gap 103 may be defined as the distance between adjacent leads at the second terminal ends 108 before etching and the etched lead-to-lead gaps may be defined as the distance between adjacent leads at the second terminal end 108 after half-etching. For instance, if the predetermined interval gap 103 is symbolically represented as $w_1$, and the etched lead-to-lead gaps are symbolically represented as $w_2$, then $w_2$ will be greater than $w_1$ ($w_2 > w_1$) after half-etching.

Figure 2:
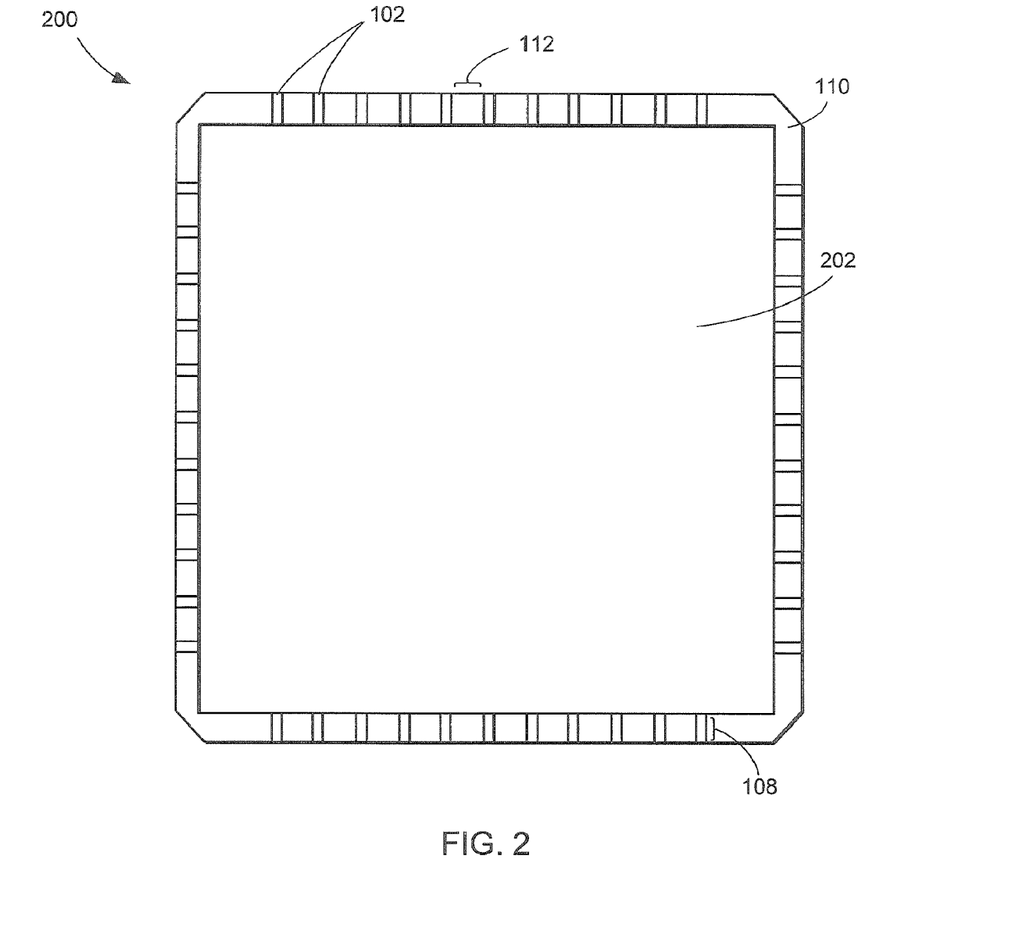
FIG. 2 is a top view of a molded half-etched dual row QFN package system in accordance with an embodiment of the present invention.

Referring now to FIG. 2, therein is shown a top view of a molded half-etched dual row QFN package system 200 in accordance with an embodiment of the present invention. The molded half-etched dual row QFN package system 200 includes the dual row leads 102, the second terminal ends 108, the flange 110, the dual row half-etched lead-to-leads gaps 112, and a molding compound 202. The first terminal ends 104 (not shown) and the molding compound 106 (not shown) are covered by the molding compound 202.

FIG. 2 illustrates that the dual row half-etched lead-to-lead gaps 112 create a larger distance between the dual row leads 102 and consequently diminishes the potential for lead-to-lead shorting and/or electrical cross talk. By removing a portion of the top half of the second terminal ends 108 (i.e.— forming the dual row half etched lead-to-lead gaps 112), the half-etching technique of the present embodiment allows the dual row half etched lead-to-lead gaps 112 to be filled with the molding compound 202 upon encapsulation. The molding compound 202 that settles into the dual row half etched lead-to-lead gaps 112 provides an insulating affect between adjacent leads, and thereby, prevents lead-to-lead shorting.

Figure 3:
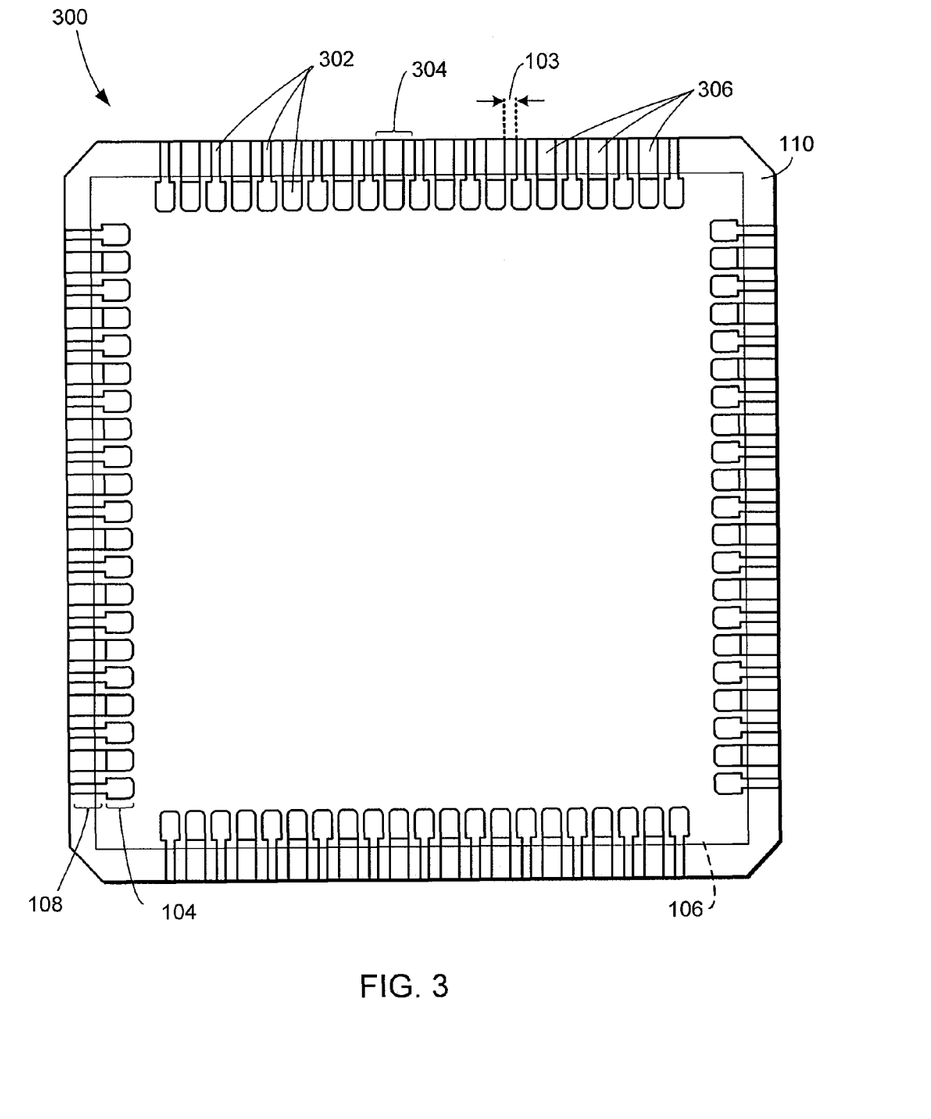
FIG. 3 is a top view of a half-etched single row QFN package system in accordance with another embodiment of the present invention.
Figure 4:
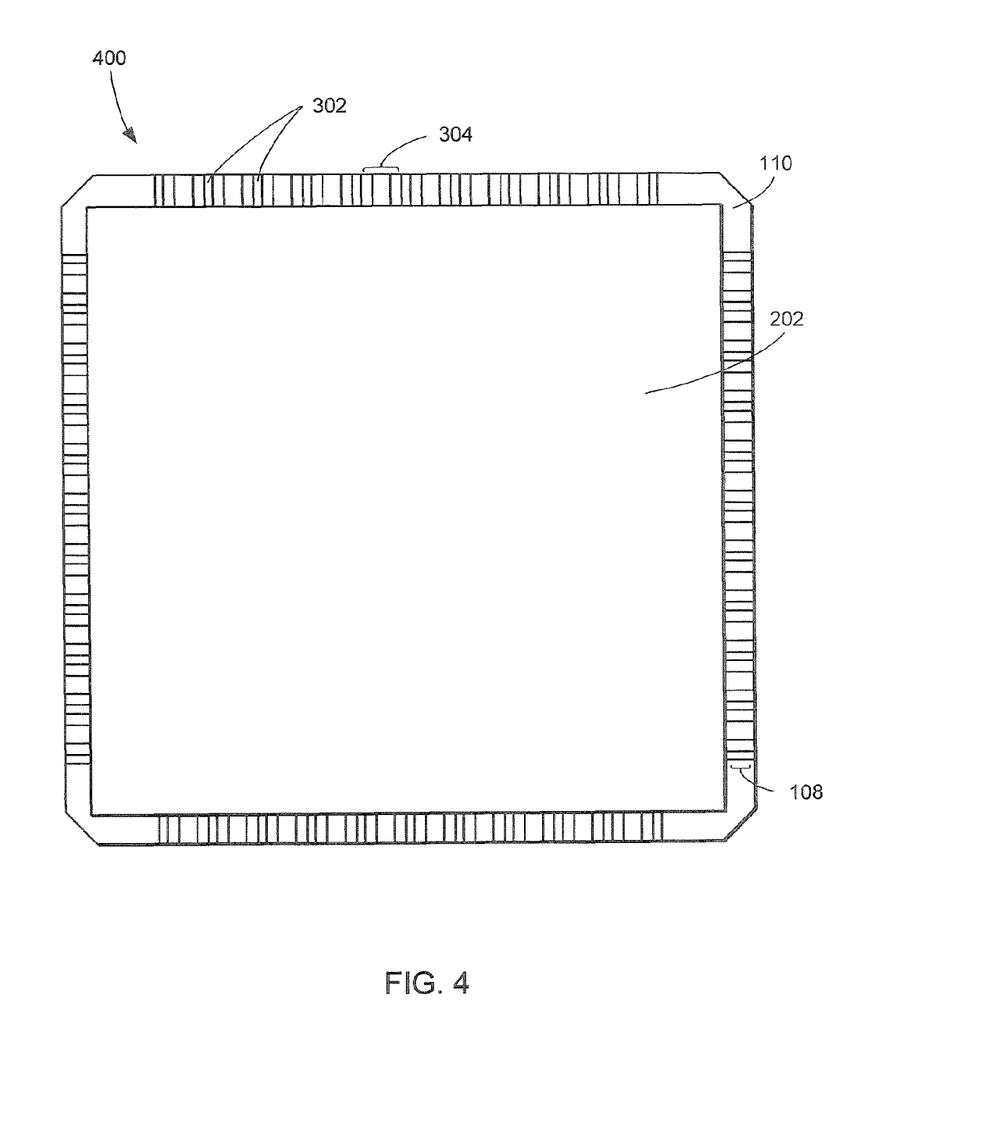
FIG. 4 is a top view of a molded half-etched single row QFN package system in accordance with another embodiment of the present invention.

FIGS. 3 and 4 depict top views of a half-etched single row QFN package. Since FIGS. 3 and 4 are subject to the same processes as FIGS. 1 and 2, only the differences between the figures will be described, to avoid redundancy.

Referring now to FIG. 3, therein is shown a top view of a half-etched single row QFN package system 300 in accordance with an embodiment of the present invention. The half-etched single row QFN package system 300 includes the predetermined interval gap 103 the first terminal ends 104, the molding compound 106, the second terminal ends 108, the flange 110, single row leads 302, etched lead-to-lead gaps, such as, single row half-etched lead-to-lead gaps 304, and single row half-etched openings 306.

The single row leads 302 are formed at a predetermined thickness and at the predetermined interval gap 103. The single row leads 302 are comprised by the first terminal ends 104, disposed adjacent the molding compound 106, and the second terminal ends 108, disposed along a periphery of a package, such as, the flange 110.

FIG. 3 illustrates the formation of the single row half-etched lead-to-lead gap 304 by creating the single row half-etched openings 306. Just as with FIGS. 1 and 2, the half-etching technique of FIG. 3 removes up to about 50% of the top portion of the second terminal ends 108 of alternating leads. However, it is to be understood that the exact amount of the second terminal ends 108 removed is not critical, what is important is that the amount removed from the second terminal ends 108 does not exceed an amount necessary to maintain the structural integrity of the single row leads 302 and/or the amount removed prevents the likelihood of lead-to-lead shorting between adjacent leads.

By employing the half-etching method to a single row QFN package, the distance between alternating leads can be increased, and the incidence of lead-to-lead shorting can be reduced by about thirty-five percent (35%).

Referring now to FIG. 4, therein is shown a top view of a molded half-etched single row QFN package system 400 in accordance with an embodiment of the present invention. The molded half-etched single row QFN package system 400 includes the second terminal ends 108, the flange 110, the molding compound 202, the single row leads 302, and the single row half-etched lead-to-leads gaps 304. FIG. 4 illustrates that the single row half-etched lead-to-lead gaps 304 create a larger distance between leads and consequently diminishes the potential for lead-to-lead shorting and/or electrical cross talk. By removing a portion of the top half of the second terminal ends 108 (i.e.—forming the single row half etched lead-to-lead gaps 304), the half-etching technique of the present embodiment allows the single row half etched lead-to-lead gaps 304 to be filled with a mold compound upon encapsulation. The mold compound that settles into the single row half etched lead-to-lead gaps 304 acts as insulation between adjacent leads and prevents lead-to-lead shorting.

FIGS. 5 through 8 will now describe embodiments of the invention wherein dual row QFN packages and/or single row QFN packages are subject to the manufacturing technique of partial half-etching.

Figure 5:
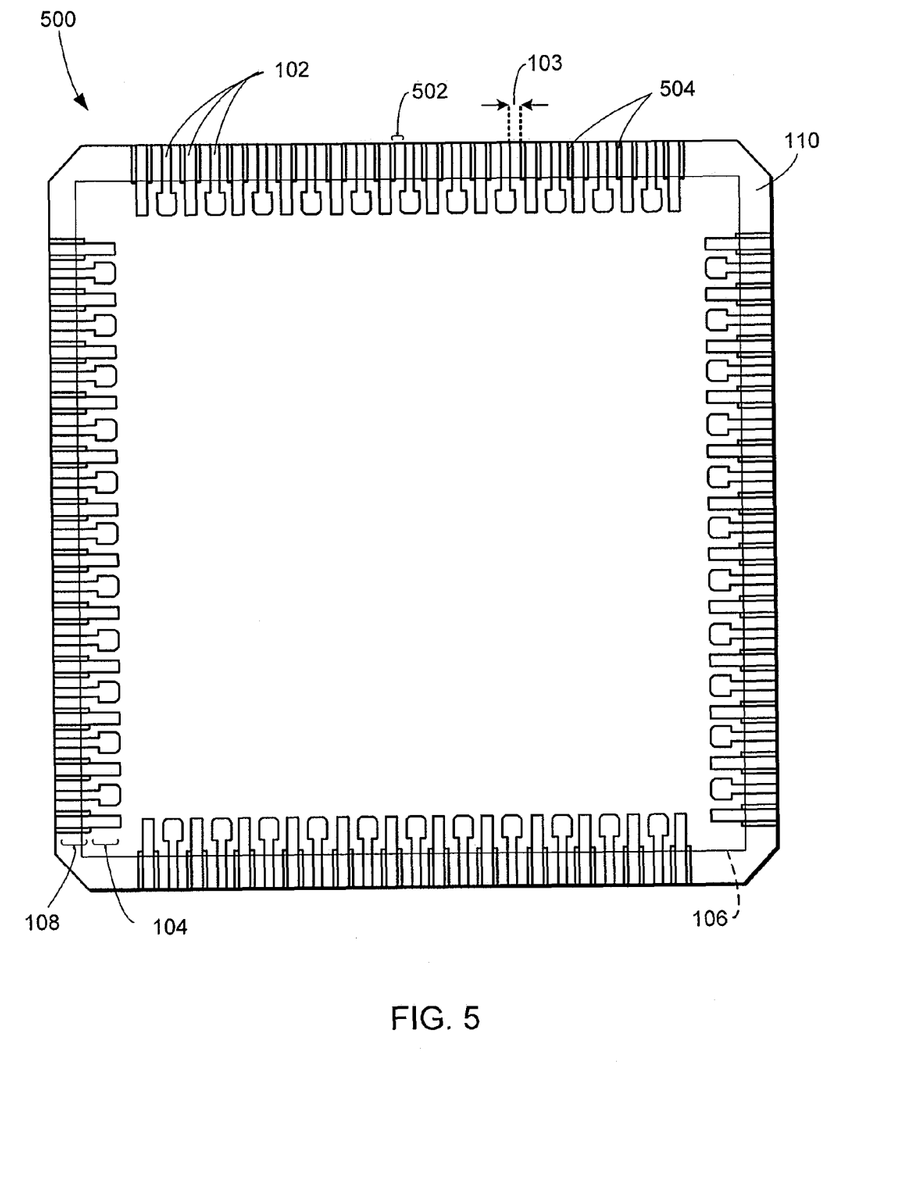
FIG. 5 is a top view of a partial half-etched dual row QFN package system in accordance with another embodiment of the present invention.

Referring now to FIG. 5, therein is shown a top view of a partial half-etched dual row QFN package system 500 in accordance with an embodiment of the present invention. The partial half-etched dual row QFN package system 500 includes the dual row leads 102, the predetermined interval gap 103, the first terminal ends 104, the molding compound 106, the second terminal ends 108, the flange 110, etched lead-to-lead gaps, such as, dual row partial half-etched lead-to-lead gaps 502, and dual row partial half-etched openings 504.

The dual row leads 102 are formed at a predetermined thickness and at the predetermined interval gap 103. The predetermined thickness and the predetermined interval gap 103 between leads are determined heuristically to be as small as possible based on the size of the package while avoiding lead-to-lead shorting and/or electrical cross-talk. The dual row leads 102 are comprised by the first terminal ends 104, disposed adjacent the molding compound 106, and the second terminal ends 108, disposed along a periphery of a package, such as, the flange 110.

FIG. 5 further illustrates the formation of the dual row partial half-etched lead-to-lead gap 502 by creating the dual row partial half-etched openings 504. For purposes of illustration and not by way of limitation, the following example is provided to elucidate the present embodiment.

As an exemplary illustration, the dual row leads 102 can be divided into a top portion (i.e.—a top half) and a bottom portion (i.e.—a bottom half). The dual row partial half-etched openings 504 are created by removing an amount from the top portion of the second terminal ends 108 of alternating leads. The amount removed forms a projection 904 (not shown) from the remaining material of the top portion of the dual row leads 102. Pursuant to partial half-etching techniques, the amount removed can be defined in two directions, a thickness direction and a height direction.

For purposes of this embodiment, thickness is defined as a measurement along the periphery of the package and height is defined as a measurement between the top and bottom of the package (i.e.—the thickness axis and the height axis are orthogonal to each other). However, it is to be understood that the amount of the second terminal ends 108 removed in either direction is not critical, what is important is that the amount removed from the second terminal ends 108, in either direction, does not exceed an amount necessary to maintain the structural integrity of the dual row leads 102 and/or the amount removed prevents the likelihood of lead-to-lead shorting between adjacent leads.

By partial half-etching the second terminal ends 108 of alternating leads, the dual row partial half-etched lead-to-lead gap 502 is increased over that of the electrical conductor to electrical conductor gap of prior art methods.

Finally, by way of example and not by way of limitation, the predetermined thickness and the predetermined interval gap 103, as mentioned above, are design parameters heuristically determined and dependent upon the specifications for the IC package. The predetermined thickness may be defined as the thickness of each of the dual row leads 102 before partial half-etching and the projection 904 may be defined as the thickness of the top portion of the dual row leads 102 after partial half-etching. For example, if the predetermined thickness is symbolically represented by $t_1$, and the projection 904 is symbolically represented by $t_2$, then $t_2$ will be less than $t_1$ ($t_2 < t_1$) after partial half-etching. Additionally, the predetermined interval gap 103 may be defined as the distance between adjacent leads at the second terminal ends 108 before etching and the etched lead-to-lead gaps may be defined as the distance between adjacent leads at the second terminal ends 108 after partial half-etching. For instance, if the predetermined interval gap 103 is symbolically represented as $w_1$, and the etched lead-to-lead gaps are symbolically represented as $w_2$, then $w_2$ will be greater than $w_1$ ($w_2 > w_1$) after partial half-etching.

Figure 6:
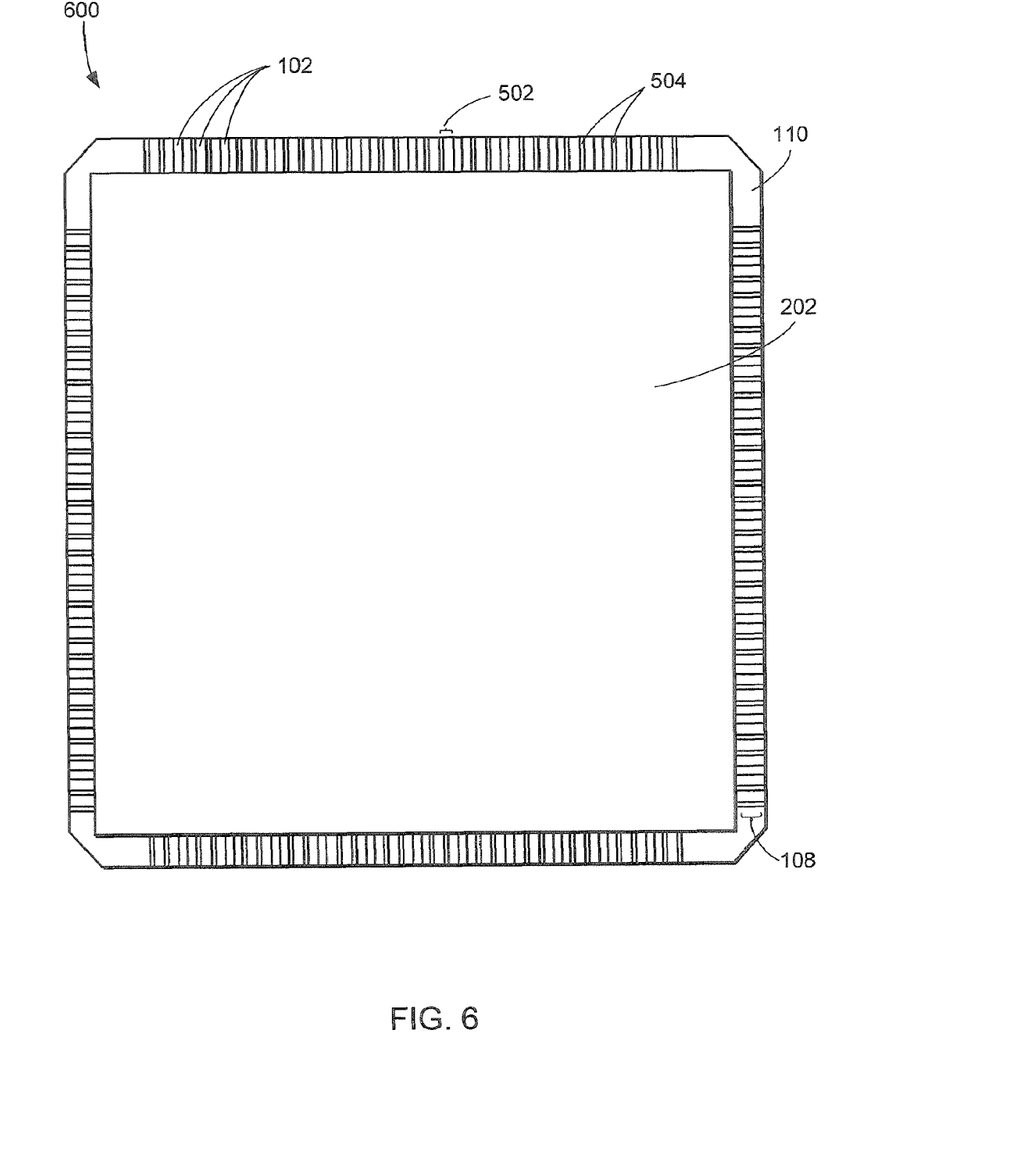
FIG. 6 is a top view of a molded partial half-etched dual row QFN package system in accordance with another embodiment of the present invention.

Referring now to FIG. 6, therein is shown a top view of a molded partial half-etched dual row QFN package system 600 in accordance with an embodiment of the present invention. The molded partial half-etched dual row QFN package system 600 includes the dual row leads 102, the second terminal ends 108, the flange 110, the molding compound 202, the dual row partial half-etched lead-to-leads gaps 502, and the dual row partial half-etched openings 504. The first terminal ends 104 (not shown) and the molding compound 106 (not shown) are covered by the molding compound 202.

FIG. 6 illustrates that the dual row partial half-etched lead-to-lead gaps 502 create a larger distance between the dual row leads 102 and consequently diminishes the potential for lead-to-lead shorting and/or electrical cross talk. By removing an amount from the top half of the second terminal ends 108 (i.e.—forming the dual row partial half-etched lead-to-lead gaps 502), the partial half-etching technique of the present embodiment allows the dual row partial half etched lead-to-lead gaps 502 to form an additional non-conducting space between the second terminal ends 108 of adjacent leads. The additional non-conducting space provides an insulating affect between adjacent leads, and thereby, prevents the incidence of lead-to-lead shorting.

Figure 7:
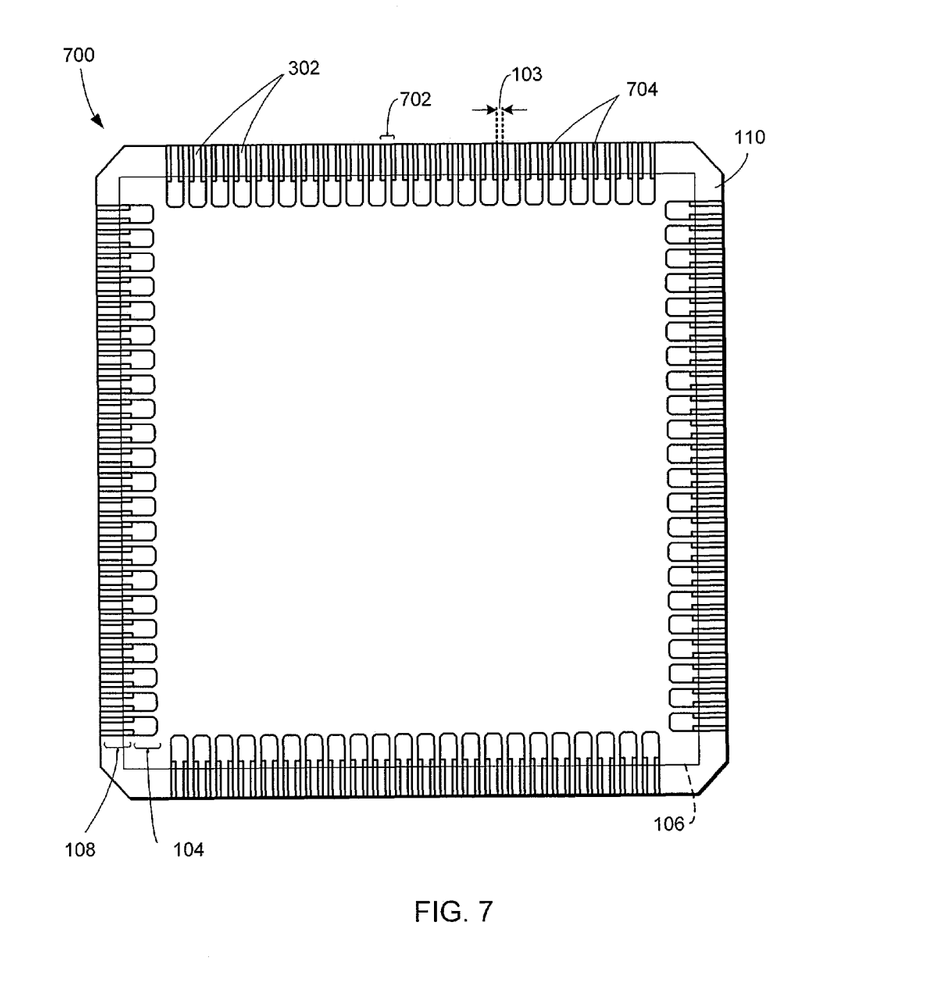
FIG. 7 is a top view of a partial half-etched single row QFN package system in accordance with another embodiment of the present invention.
Figure 8:
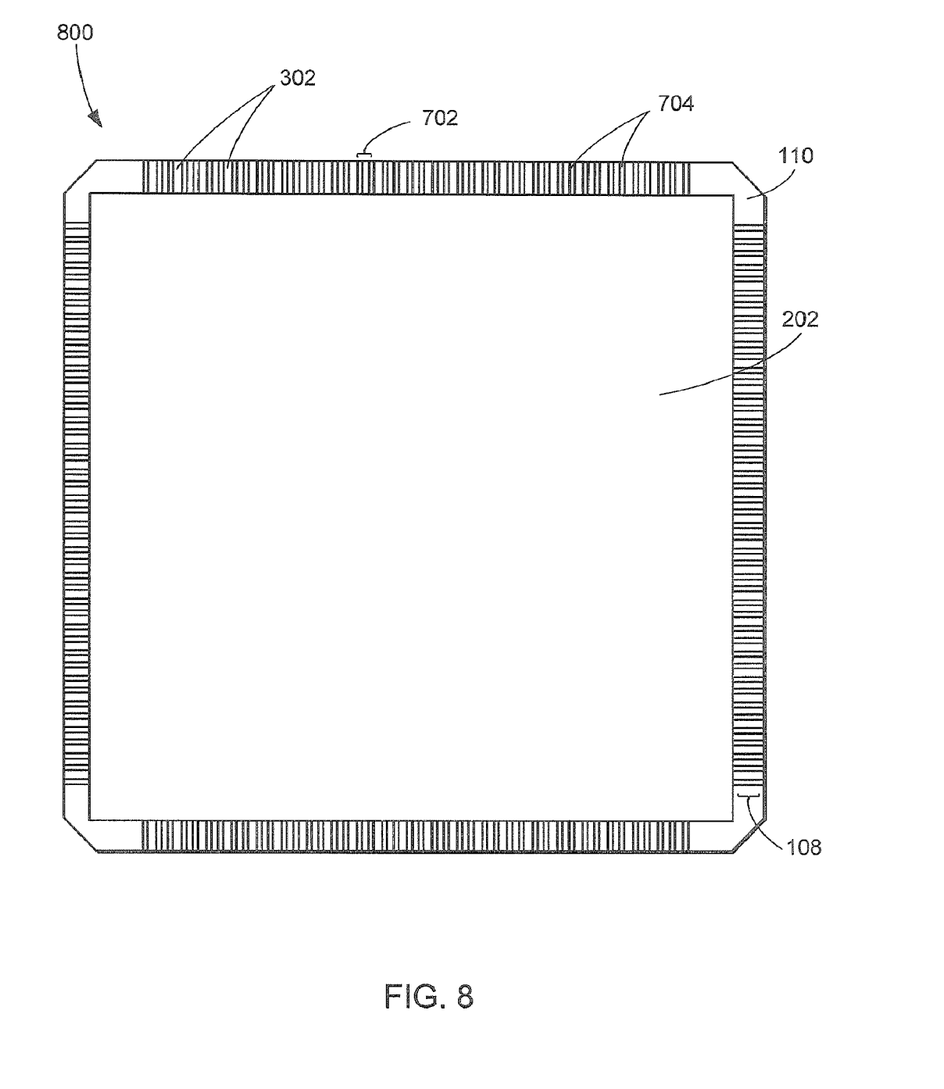
FIG. 8 is a top view of a molded partial half-etched single row QFN package system in accordance with another embodiment of the present invention.

FIGS. 7 and 8 depict top views of a partial half-etched single row QFN package. Since FIGS. 7 and 8 are subject to the same processes as FIGS. 5 and 6, only the differences between the figures will be described, to avoid redundancy.

Referring now to FIG. 7, therein is shown a top view of a partial half-etched single row QFN package system 700 in accordance with an embodiment of the present invention. The partial half-etched single row QFN package system 700 includes the predetermined interval gap 103, the first terminal ends 104, the molding compound 106, the second terminal ends 108, the flange 110, the single row leads 302, etched lead-to-lead gaps, such as, single row partial half-etched lead-to-lead gaps 702, and single row partial half-etched openings 704.

The single row leads 302 are formed at a predetermined thickness and at the predetermined interval gap 103 at the second terminal ends 108. The single row leads 302 are comprised by the first terminal ends 104, disposed adjacent the molding compound 106, and the second terminal ends 108, disposed along a periphery of a package, such as, the flange 110.

FIG. 7 illustrates the formation of the single row partial half-etched lead-to-lead gap 702 by creating the single row partial half-etched openings 704. However, it is to be understood that the amount of the second terminal ends 108 removed in either direction is not critical, what is important is that the amount removed from the second terminal ends 108, in either direction, does not exceed an amount necessary to maintain the structural integrity the dual row leads 102 and/or the amount removed prevents the likelihood of lead-to-lead shorting between adjacent leads.

By partial half-etching the second terminal ends 108, the single row partial half-etched lead-to-lead gap 702 is increased over that of the electrical conductor to electrical conductor gap of prior art methods.

Referring now to FIG. 8, therein is shown a top view of a molded partial half-etched single row QFN package system 800 in accordance with an embodiment of the present invention. The molded partial half-etched single row QFN package system 800 includes the second terminal ends 108, the flange 110, the molding compound 202, the single row leads 302, the single row partial half-etched lead-to-leads gaps 702, and the single row partial half-etched openings 704. FIG. 8 illustrates that the single row partial half-etched lead-to-lead gaps 702 create a larger distance between leads and consequently diminishes the potential for lead-to-lead shorting and/or electrical cross talk. By removing an amount from the top half of the second terminal ends 108 (i.e.—forming the single row partial half-etched lead-to-lead gaps 702), the partial half-etching technique of the present embodiment allows the single row partial half etched lead-to-lead gaps 702 to form an additional non-conducting space between the second terminal ends 108 of adjacent leads. The additional non-conducting space provides an insulating affect between adjacent leads, and thereby, prevents lead-to-lead shorting.

Figure 9:
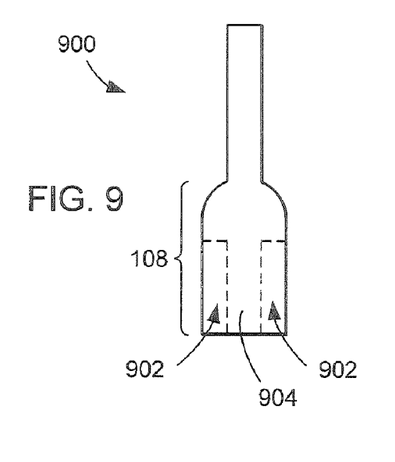
FIG. 9 is a plan view of a partial half-etched without angle dual row lead in accordance with an embodiment of the present invention.

Referring now to FIG. 9, therein is shown a plan view of a partial half-etched without angle dual row lead 900 in accordance with an embodiment of the present invention. The partial half-etched without angle dual row lead 900 illustrated in FIG. 9 includes the second terminal ends 108 of a lead located along the periphery of the system. An area 902 of the second terminal ends 108 of the partial half-etched without angle dual row lead 900 is removed by masking with a negative or positive photoresist and employing either an isotropic or anisotropic etchant. The partial half-etching of the second terminal ends 108 removes material from the top portion of each alternating lead, as described above by FIG. 5.

By removing material from the top portion of the second terminal ends 108 of the partial half-etched without angle dual row lead 900, the distance between adjacent leads is increased and lead-to-lead shorting can be prevented. The partial half-etched without angle dual row lead 900 possesses, after partial half-etching, a projection 904. The projection 904 terminates near the base of the second terminal ends 108 at about a 90° angle. As used herein, the term "without angle" refers to an angle of about 90°.

Figure 10:
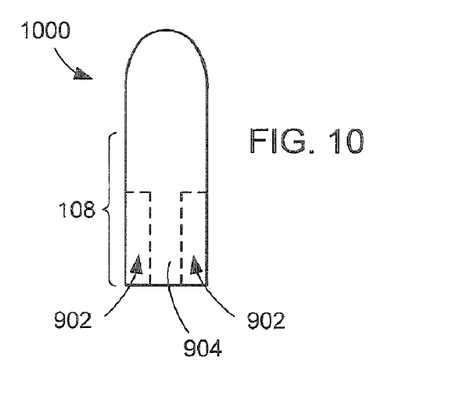
FIG. 10 is a plan view of a partial half-etched without angle single row lead in accordance with an embodiment of the present invention.

Referring now to FIG. 10, therein is shown a plan view of a partial half-etched without angle single row lead 1000 in accordance with an embodiment of the present invention. The partial half-etched without angle single row lead 1000 illustrated in FIG. 10 includes the second terminal ends 108 of a lead located along the periphery of the system. The area 902 of the second terminal ends 108 of the partial half-etched without angle single row lead 1000 is removed by masking with a negative or positive photoresist and employing either an isotropic or anisotropic etchant. The partial half-etching of the second terminal ends 108 removes material form the top portion of each lead, as described above by FIG. 7.

By removing material from the top portion of the second terminal ends 108 of the partial half-etched without angle single row lead 1000, the distance between adjacent leads is increased and lead-to-lead shorting can be eliminated. The partial half-etched without angle single row lead 1000 possesses, after partial half-etching, the projection 904. The projection 904 terminates near the base of the second terminal ends 108 at about a 90° angle. As stated above, the term "without angle" refers to an angle of about 90°.

Figure 11:
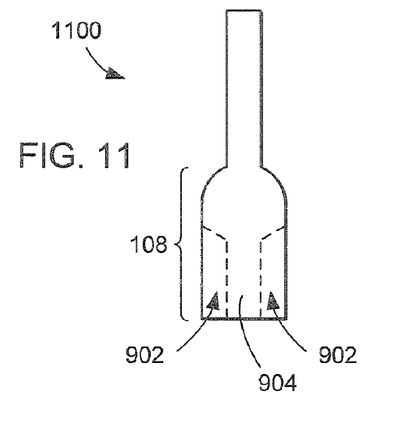
FIG. 11 is a plan view of a partial half-etched with angle dual row lead in accordance with an embodiment of the present invention.

Referring now to FIG. 11, therein is shown a plan view of a partial half-etched with angle dual row lead 1100 in accordance with an embodiment of the present invention. The partial half-etched with angle dual row lead 1100 illustrated in FIG. 11 includes the second terminal ends 108 of a lead located along the periphery of the system. The area 902 of the second terminal ends 108 of the partial half-etched with angle dual row lead 1100 is removed by masking with a negative or positive photoresist and employing either an isotropic or anisotropic etchant. The partial half-etching of the second terminal ends 108 removes material from the top portion of each alternating lead, as described above by FIG. 5.

By removing material from the top portion of the second terminal ends 108 of the partial half-etched with angle dual row lead 1100, the distance between adjacent leads is increased and lead-to-lead shorting can be eliminated. The partial half-etched with angle dual row lead 1100 possesses, after partial half-etching, the projection 904. The projection 904 terminates near the base of the second terminal ends 108 in excess of about a 90° angle. As used herein, the term "with angle" refers to an angle in excess of about 90°.

Figure 12:
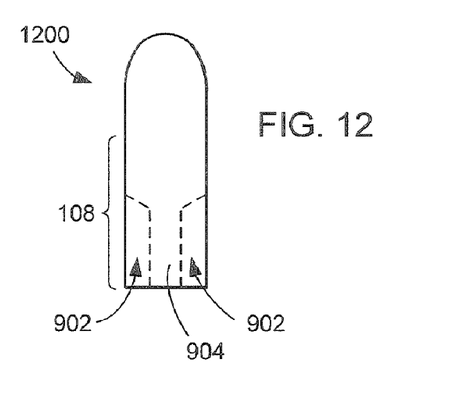
FIG. 12 is a plan view of a partial half-etched with angle single row lead in accordance with an embodiment of the present invention.

Referring now to FIG. 12, therein is shown a plan view of a partial half-etched with angle single row lead 1200 in accordance with an embodiment of the present invention. The partial half-etched with angle single row lead 1200 illustrated in FIG. 12 includes the second terminal ends 108 of a lead located along the periphery of the system. The area 902 of the second terminal ends 108 of the partial half-etched with angle single row lead 1200 is removed by masking with a negative or positive photoresist and employing either an isotropic or anisotropic etchant. The partial half-etching of the second terminal ends 108 removes material from the top portion of each lead, as described above by FIG. 7.

By removing material from the top portion of the second terminal ends 108 of the partial half-etched with angle single row lead 1200, the distance between adjacent leads is increased and lead-to-lead shorting can be eliminated. The partial half-etched with angle single row lead 1200 possesses, after partial half-etching, the projection 904. The projection 904 terminates near the base of the second terminal ends 108 in excess of about a 90° angle. As stated above, the term "with angle" refers to an angle in excess of about 90°.

Figure 13:
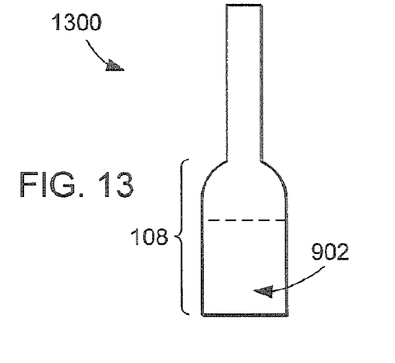
FIG. 13 is a plan view of a half-etched dual row lead in accordance with an embodiment of the present invention.

Referring now to FIG. 13, therein is shown a plan view of a half-etched dual row lead 1300 in accordance with an embodiment of the present invention. The half-etched dual row lead 1300 illustrated in FIG. 13 includes the second terminal ends 108 of a lead located along the periphery of the system. The area 902 of the second terminal ends 108 of the half-etched dual row lead 1300 is removed by masking with a negative or positive photoresist and employing either an isotropic or anisotropic etchant. The second terminal ends 108 are etched to fully remove the top portion within the boundaries of the area 902, as described above by FIG. 1. By etching the region within the boundaries of the area 902, the distance between adjacent leads at the second terminal ends 108 is increased and lead-to-lead shorting can be prevented.

Figure 14:
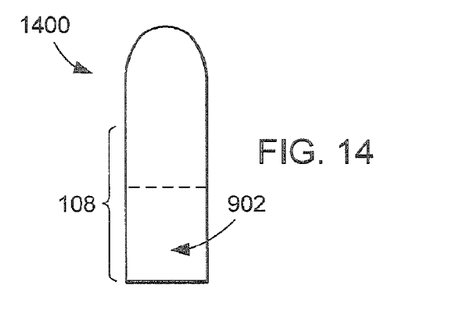
FIG. 14 is a plan view of a half-etched single row lead in accordance with an embodiment of the present invention.

Referring now to FIG. 14, therein is shown a plan view of a half-etched single row lead 1400 in accordance with an embodiment of the present invention. The half-etched single row lead 1400 illustrated in FIG. 14 includes the second terminal ends 108 of a lead located along the periphery of the system. The area 902 of the second terminal ends 108 of the half-etched single row lead 1400 is removed by masking with a negative or positive photoresist and employing either an isotropic or anisotropic etchant. The second terminal ends 108 are etched to fully remove the top portion within the boundaries of the area 902, as described above by FIG. 3. By etching the region within the boundaries of the area 902, the distance between adjacent leads at the second terminal ends 108 is increased and lead-to-lead shorting can be prevented.

Figure 15:
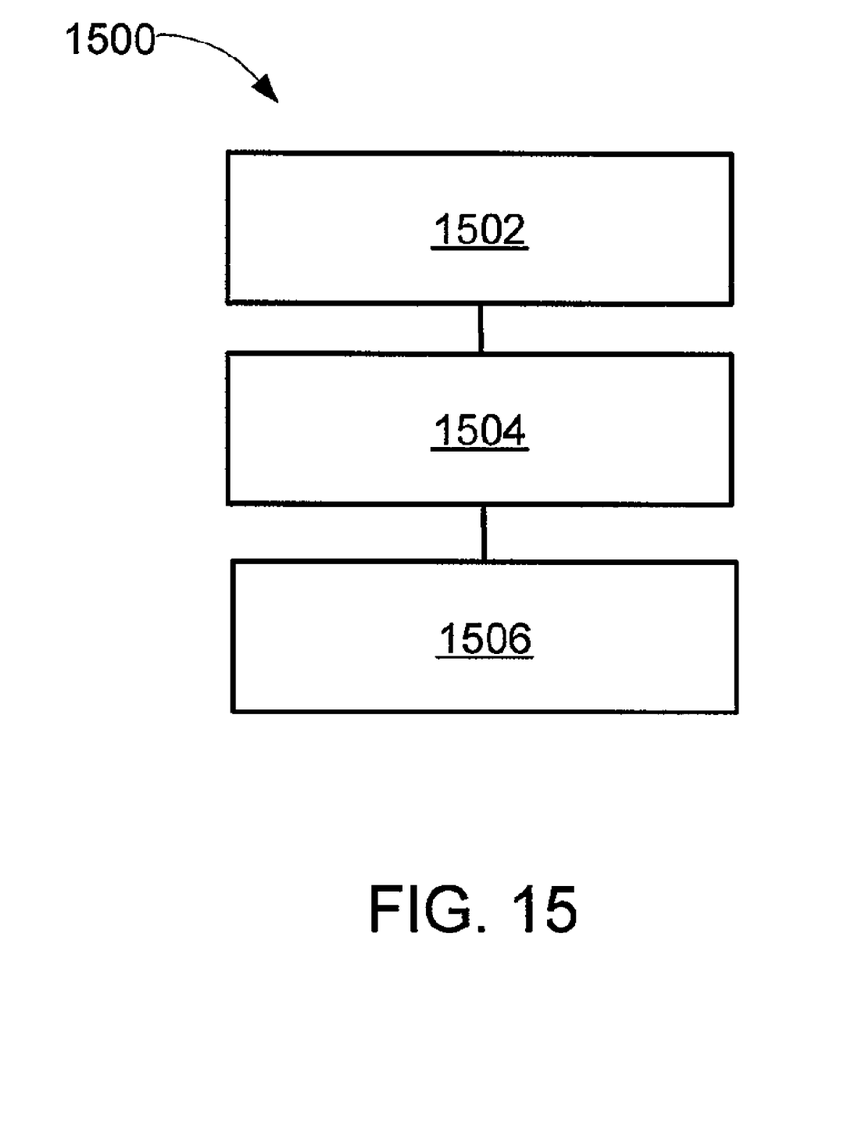
FIG. 15 is a flow chart for fabricating an integrated circuit non-leaded leadframe system in accordance with an embodiment of the present invention.

Referring now to FIG. 15, therein is shown a flow chart of an integrated circuit packaging system 1500 for manufacturing an integrated circuit package system in accordance with an embodiment of the present invention. The integrated circuit packaging system 1500 includes forming a plurality of leads with a predetermined thickness and a predetermined interval gap between each of the plurality of leads in a block 1502; configuring each one of the plurality of leads to include first terminal ends disposed adjacent an integrated circuit and second terminal ends disposed along a periphery of a package in a block 1504; and forming the second terminal ends of alternating leads disposed along the periphery of the package to form an etched lead-to-lead gap in excess of the predetermined interval gap in a block 1506.

It has been discovered that the present invention has a distinct advantage over what has been commonly employed in the IC packaging industry. The advantage is that finer pitch packages can be created due to the prevention of lead-to-lead shorting between adjacent leads. This and other valuable aspects of the present invention consequently further the state of the technology to at least the next level.

Thus, it has been discovered that the integrated circuit non-leaded package system of the present invention furnishes important and heretofore unknown and unavailable solutions, capabilities, and functional advantages. For instance, a finer pitch package design may be employed without suffering the fatal design flaw of lead-to-lead shorting. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit package comprising:

forming a plurality of leads with a predetermined thickness and a predetermined interval gap between each of the plurality of leads as a dual row quad flat non-leaded package or a single row quad flat non-leaded package; configuring each one of the plurality of leads to include first terminal ends disposed adjacent an integrated circuit and second terminal ends disposed along a periphery of a package; and forming the second terminal ends of alternating leads disposed along the periphery of the package to form a half-etched lead-to-lead gap in excess of the predetermined interval gap, wherein the half-etched lead-to-lead gap is formed after forming the plurality of leads with the predetermined thickness and the predetermined interval gap.

2. The method as claimed in claim 1 wherein:

forming the second terminal ends for preventing interval gap lead-to-lead shorting.

3. The method as claimed in claim 1 wherein:

forming the second terminal ends includes partial half-etching the second terminal ends of the alternating leads to form a projection with or without an angled base.

4. The method as claimed in claim 1 wherein:

forming the second terminal ends includes partial half-etching all of the second terminal ends to form a projection with or without an angled base.

5. A method of manufacture of an integrated circuit package comprising:

forming an electrically conductive layer; masking the electrically conductive layer to form a plurality of leads with a predetermined thickness and a predetermined interval gap between each of the plurality of leads; forming each one of the plurality of leads to include first terminal ends disposed adjacent an integrated circuit and second terminal ends disposed along the periphery of a package; defining an amount to be removed from the second terminal ends of alternating leads for preventing interval gap lead shortage; masking the second terminal ends of the alternating leads; and etching the second terminal ends of the alternating leads to form a half-etched lead-to-lead gap between adjacent leads at the second terminal ends in excess of the predetermined interval gap, wherein the half-etched lead-to-lead gap is formed after forming the plurality of leads with the predetermined thickness and the predetermined interval gap.

6. The method as claimed in claim 5 wherein:

masking the electrically conductive layer or masking the second terminal ends of the alternating leads can be done with either a negative photoresist or positive photoresist.

7. The method as claimed in claim 5 wherein:

etching the second terminal ends of the alternating leads employs either an isotropic or anisotropic etchant.

8. The method as claimed in claim 5 wherein:

etching includes half-etching the second terminal ends of the alternating leads.

9. The method as claimed in claim 5 wherein:

etching includes half-etching all of the second terminal ends.

* * * * *